(12) United States Patent
Kishino et al.

(10) Patent No.: US 7,388,327 B2
(45) Date of Patent: Jun. 17, 2008

(54) LIGHT-EMITTING DEVICE AND DISPLAY APPARATUS

(75) Inventors: Kengo Kishino, Kanagawa (JP); Shinjiro Okada, Kanagawa (JP); Akira Tsuboyama, Tokyo (JP); Satoshi Igawa, Kanagawa (JP); Manabu Furugori, Tokyo (JP); Hironobu Iwawaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 522 days.

(21) Appl. No.: 10/924,806

(22) Filed: Aug. 25, 2004

(65) Prior Publication Data
US 2005/0084710 A1    Apr. 21, 2005

(30) Foreign Application Priority Data
Aug. 29, 2003   (JP)   .............................. 2003-305851
Aug. 2, 2004    (JP)   .............................. 2004-225630

(51) Int. Cl.
*H01L 51/54*   (2006.01)

(52) U.S. Cl. ........................ 313/504; 428/690; 428/917; 257/102; 257/103; 257/E51.044

(58) Field of Classification Search ........................ None
See application file for complete search history.

(56) References Cited

U.S. PATENT DOCUMENTS

| | | | |
|---|---|---|---|
| 6,310,361 B1 | 10/2001 | Lichter | 257/48 |
| 6,812,497 B2 | 11/2004 | Kamatani et al. | 257/79 |
| 6,824,894 B2 | 11/2004 | Takiguchi et al. | 428/690 |
| 2001/0019782 A1 | 9/2001 | Igarashi et al. | 428/690 |
| 2002/0125818 A1 | 9/2002 | Sato et al. | 313/504 |
| 2003/0141809 A1 | 7/2003 | Furugori et al. | 313/504 |
| 2003/0186080 A1 | 10/2003 | Kamatani et al. | 428/690 |
| 2003/0218418 A9 | 11/2003 | Sato et al. | 313/504 |
| 2003/0224208 A1 | 12/2003 | Kamatani et al. | 428/690 |
| 2004/0169461 A1 | 9/2004 | Moriyama et al. | 313/504 |
| 2004/0178720 A1* | 9/2004 | Lee et al. | 313/504 |

FOREIGN PATENT DOCUMENTS

| | | |
|---|---|---|
| JP | 2003/77674 | 3/2003 |
| JP | 2003-151773 | 5/2003 |

OTHER PUBLICATIONS

M. A. Baldo et al., "Very High-Efficiency Green Organic Light-Emitting Devices Based on Electrophosphorescence", *Applied Physics Letters*, vol. 75, No. 1, Jul. 5, 1999, pp. 4-6.

D. F. O'Brien et al., "Improved Energy Transfer in Electrophosphorescent Devices", *Appl. Phys. Lett.*, vol. 74, No. 3, Jan. 18, 1999, pp. 442-444.

M. A. Baldo et al., "High-Efficiency Fluorescent Organic Light-Emitting Devices Using a Phosphorescent Sensitizer", *Nature*, vol. 403, Feb. 17, 2000, pp. 750-753.

Brian W. D'Andrade et al., "High-Efficiency Yellow Double-Doped Organic Light-Emitting Devices Based on Phosphor-Sensitized Fluorescence", *Applied Physics Letters*, vol. 79, No. 7, Aug. 13, 2001, pp. 1045-1047.

* cited by examiner

*Primary Examiner*—Marie R. Yamnitzky
(74) *Attorney, Agent, or Firm*—Fitzpatrick, Cella, Harper & Scinto

(57) ABSTRACT

The object of the present invention is to provide a light-emitting device that emits phosphorescence with high efficiency. The light-emitting device of the present invention includes a host containing two kinds of dopants, wherein a dopant having a longer maximum-emission wavelength is doped in a low concentration and has a substituent.

6 Claims, 6 Drawing Sheets

LIGHT-EMITTING DEVICE AND DISPLAY APPARATUS

BACKGROUND OF THE INVENTION

1. Field of the Invention

The present invention relates to a light-emitting device containing a phosphorescent metal complex having an organic ligand, and a display apparatus including the light-emitting device.

2. Related Background Art

There has been known an organic electroluminescence device (hereinafter, also referred to as "organic EL device") as a light-emitting device.

The organic EL device has at least one organic layer provided between electrodes. An organic layer may have a multilayer structure, for example, a three-layer structure including a hole transporting layer, a light-emitting layer, and an electron transporting layer, or a four-layer structure including a hole transporting layer, a light-emitting layer, an exciton diffusion blocking layer, and an electron transporting layer.

The hole transporting layer may be composed of α-NPD. The light-emitting layer may be composed of Alq3, CBP as a host doped with Ir(ppy)$_3$ or CBP as a host doped with PtOEP. The exciton diffusion blocking layer may be composed of BCP. The respective compounds are listed below in full.

Alq3: aluminum-quinolinol complex
α-NPD: N4,N4'-Di-naphthalen-1-yl-N4,N4'-diphenyl-biphenyl-4,4'-diamine
CBP: 4,4'-N,N'-dicarbazole-biphenyl
BCP: 2,9-dimethyl-4,7-diphenyl-1,10-phenanthroline
PtOEP: platinum octaethylporphyrin complex
Ir(ppy)$_3$: iridium-phenylpyridine complex The structures of the above compounds except PtOEP are shown in FIG. 3.

Also, an electron transporting material includes oxadiazole derivatives.

Examples of an organic EL device making use of phosphorescence are reported in, for example, "Improved Energy Transfer in Electrophosphorescent Device" (D. F. O'Brien et al., Applied Physics Letters Vol. 74, No. 3, p. 422 (1999)) and "Very High-efficiency Green Organic Light-emitting Devices based on Electrophosphorescence" (M. A. Baldo et al., Applied Physics Letters Vol. 75, No. 1, p. 4 (1999)).

The technique of converting an excitation energy from triplet excitation to singlet excitation is disclosed by U.S. Pat. No. 6,310,361, Applied Physics Letters: 79, 7, 1045 (2001), and Nature: Vol. 403, 750 (2000).

Besides, Japanese Patent Application Laid-Open No. 2003-077674 discloses that an energy is converted from a triplet exciton to triplet excitation and light is emitted from the triplet excitation.

However, none of the above techniques offer a satisfactory device in terms of phosphorescence efficiency, device lifetime, and power consumption.

SUMMARY OF THE INVENTION

The present invention has been made in light of solving the above-mentioned problem and therefore has an object to provide a light-emitting device that emits phosphorescence and is adequate for practical use.

Therefore, the present invention provides a light-emitting device comprising: a pair of electrodes; and a light-emitting layer provided between the pair of electrodes, wherein the light-emitting layer has a host and two kinds of dopants, and wherein each of the two kinds of dopants is a phosphorescent metal complex having an organic ligand, and among the two types of dopants, a dopant having a longer maximum-emission wavelength has a substituent in a ligand structure and is contained in the light-emitting layer at a lower concentration than the concentration of the other dopant.

According to the present invention, a light-emitting device emitting phosphorescence can be provided, which is adequate for practical use with a high efficiency, long lifetime, and low power consumption.

DESCRIPTION OF THE PREFERRED EMBODIMENTS

Figure 1A:
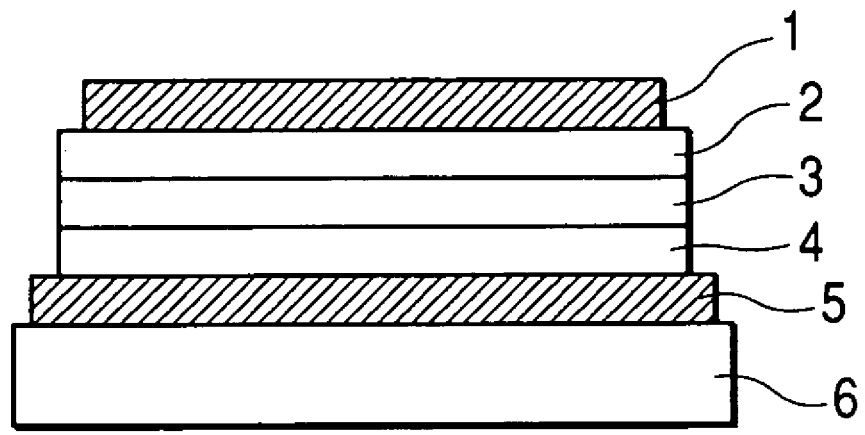
FIGS. 1A and 1B are schematic sectional views showing two kinds of light-emitting devices according to the present invention.

The light-emitting device of the present invention is a light-emitting device comprising a light-emitting layer having a host and two kinds of dopants, wherein each of the two kinds of dopants is a phosphorescent metal complex having an organic ligand, and wherein among the two types of dopants, a dopant having a longer maximum-emission wavelength has a substituent in a ligand structure and is contained in the light-emitting layer at a lower concentration than the concentration of the other dopant.

The term "light-emitting layer" used herein refers to a layer functioning to emit light among organic layers interposed between electrodes. The term "host" means a main component in the light-emitting layer. Thus, the term "dopant" means a component slightly contained in the light-emitting layer.

In the present invention, each of two dopants can emit phosphorescence in the absence of the other dopant.

The light-emitting layer may contain not only the two kinds of dopants but also any other dopants. In the presence of any other dopants, energy transfer is efficiently carried out between the two kinds of dopants and a low-concentration dopant emits light with a longer wavelength.

The light-emitting layer may contain another component in addition to the host and dopant.

In the light-emitting device, the dopant which emits light with at least a longer wavelength (dopant with a longer maximum-emission wavelength) emits light among the two kinds of dopants. Of course, each of the dopants can emit light, but the dopant emitting light with a longer wavelength preferably emits light for main light emission. The term "main light emission" refers to emission from a dopant emitting light with a longer wavelength as the maximum-wavelength at an emission spectrum peak which can be observed from the light-emitting device. In the presence of two dopants different in wavelength, a spectrum peak of the two kinds of dopants in combination at the maximum emission intensity may fail to match with their respective spectrum peaks at the time when the two kinds of dopants emit light independently of each other, and slightly deviate therefrom. In the present invention, it is preferable to adopt light emission spectrum peak of those spectrum peaks, which is closer to the emission spectrum peak of the dopant emitting light with a longer wavelength, and is farther from an emission spectrum peak of the dopant (the other dopant) emitting light with a shorter wavelength. Based on the above, the light-emitting device of the present invention will be regarded as one capable of performing light emission from the dopant emitting light with a longer wavelength.

A concentration of the dopant means a ratio of dopants contained in the light-emitting layer to all components in the light-emitting layer. The unit of the concentration is expressed by "wt. %".

The dopant emitting light with a longer wavelength has a substituent in a ligand structure. The substituent can thus reduce an intermolecular interaction and control an intermolecular quenching mechanism.

With such a structure, the energy transfer to the dopant emitting phosphorescence from the other dopant capable of emitting phosphorescence (assist dopant) can be efficiently carried out. Further, it is possible to control intermolecular quenching with the dopant emitting phosphorescence, resulting in improved emission efficiency. Thus, a light-emitting device that attains longer lifetime and low power consumption can be provided as the light-emitting device.

In the present invention, the two kinds of dopants are preferably complexes having similar structures. The term "similar structures" refers to structures having the same central metal or structures having a substituent or no substituent where one dopant with the longer maximum-emission wavelength has a structure of the other dopant (unsubstituted) and a substituent thereon. The central metal is particularly preferably iridium, but may be platinum, copper, or rhenium. Ligands of both dopants are preferably 1-phenylisoquinoline. As another preferable example, at least the other dopant has a ligand of benzoquinoline.

In the present invention, preferably, a phosphorescence lifetime of at least the main light-emitting material (dopant with the longer maximum-emission wavelength) is as short as 1.6 µs or less.

Also, in the present invention, preferably, a peak difference between the emission spectrum peaks specific to the main light-emitting material and an auxiliary light-emitting material (the other dopant) is 30 nm or shorter. With such a relation, the energy transfer between the two dopants can be facilitated and/or even with the two kinds of dopants, it is possible to visually reproduce color of main light emission.

Also, in the present invention, preferably, the auxiliary light-emitting material (the other dopant) has structural isomers both of which are preferably contained in the light-emitting layer. Such a structure provides the broad emission wavelength range and facilitates the energy transfer to the main light-emitting material and/or the presence of the structural isomers having the same property prevents crystallization in the light-emitting layer.

At least one of the electrodes is preferably transparent. Also, the electrode may be suitably selected while considering electron injection property and hole injection property. Examples of the transparent electrode material include ITO and IZO. The other electrode may be composed of aluminum, gold, platinum, chromium, copper or the like alone, or may be one containing at least one of those elements.

It is also preferable that the light-emitting device be designed to be protected from oxygen or moisture if necessary. For example, the light-emitting device may be provided with a sealing can or sealing film containing either an organic material or an inorganic material.

In the present invention, the light-emitting device can be used for a display apparatus such as a display, for example, for a pixel unit or sub-pixel unit of the display. The term "display" refers to a display apparatus installed in a television, a personal computer, a digital camera, a camcorder, etc., or refers to a display apparatus mounted to a vehicle body. Alternatively, the light-emitting device can be used as an illuminator or a display unit of an image forming apparatus employing an electrophotographic process or an exposure light source for a photosensitive member.

The light-emitting device may be used alone or a plurality of light-emitting devices may be used in combination. In the case of using the plurality of the devices, the devices may be driven in a passive or active matrix manner to emit light. Also, in such a case, the respective devices may be identical or different in emission light color. In the case of using the plurality of the devices different in emission light color, it is possible to carry out full-color emission. Also, the light-emitting device may have a so-called bottom emission structure wherein light can be received from a substrate side or a top emission structure wherein light can be received from the side opposite to the substrate.

Figure 1B:
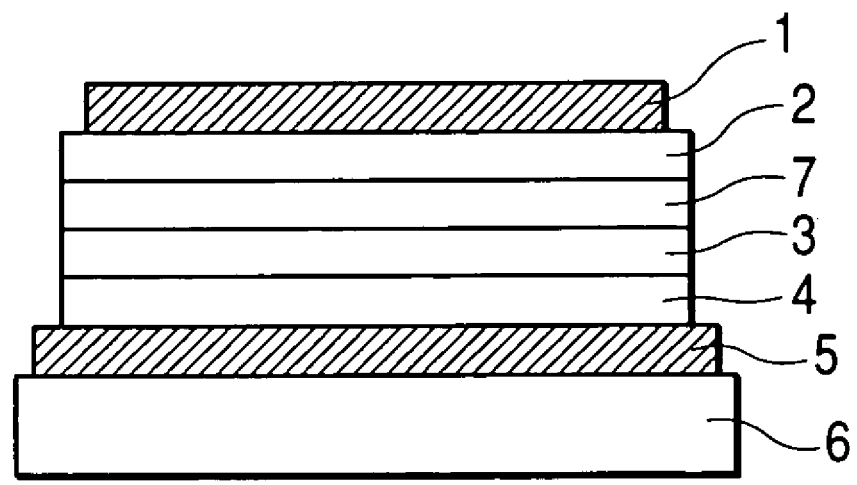

As shown in FIGS. 1A and 1B, the light-emitting device may have three and four organic layers, respectively. FIGS. 1A and 1B are schematic sectional views each showing the light-emitting device according to the present embodiment. Reference numeral 1 denotes a metal electrode; 2, an electron transporting layer; 3, a light-emitting layer; 4, a hole transporting layer; 5, a transparent electrode; 6, a transparent substrate; and 7, an exciton diffusion blocking layer.

Figure 4:
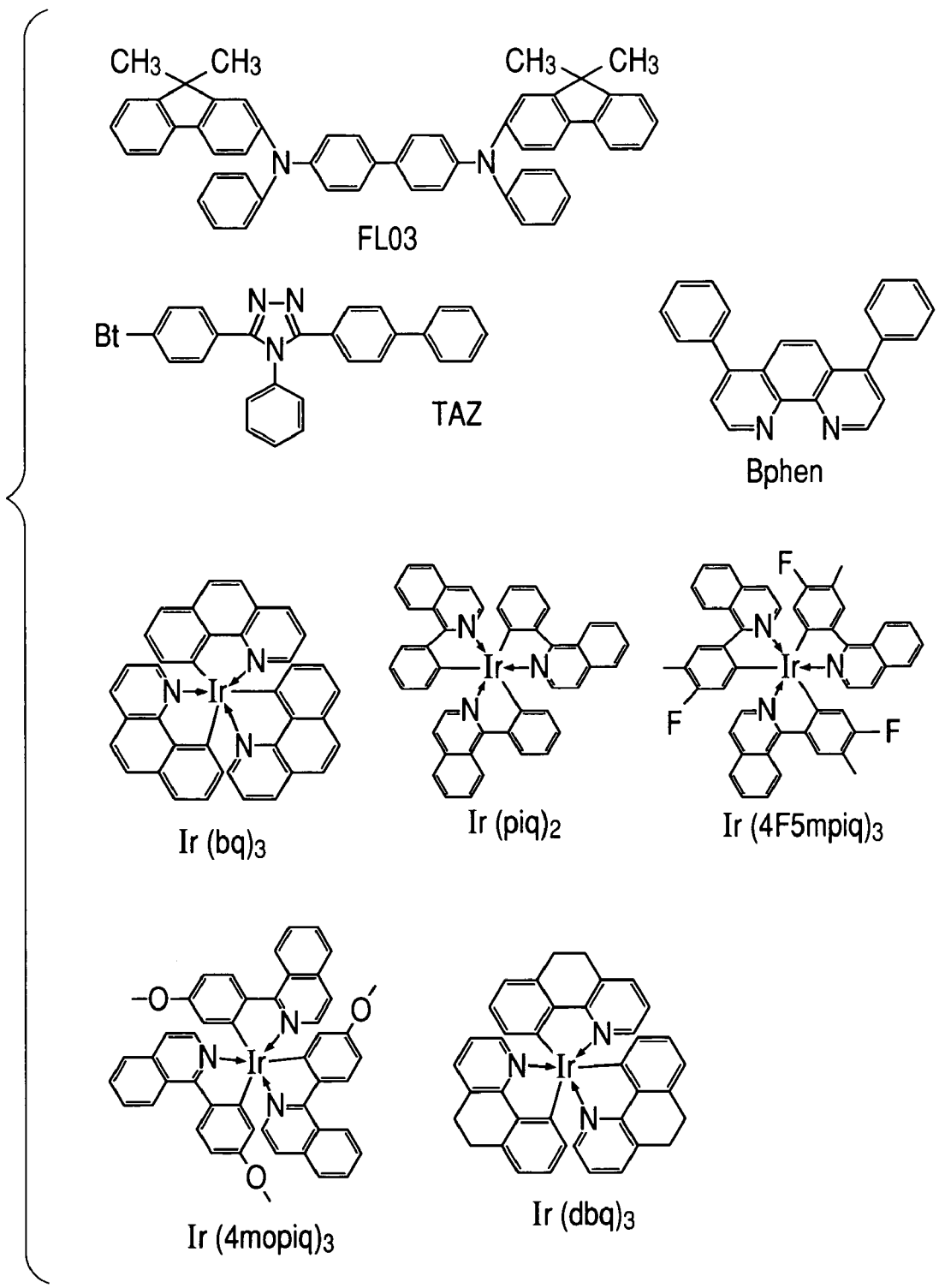
FIG. 4 shows chemical structure of the organic compounds used in the light-emitting device of the present invention.
Figure 5:
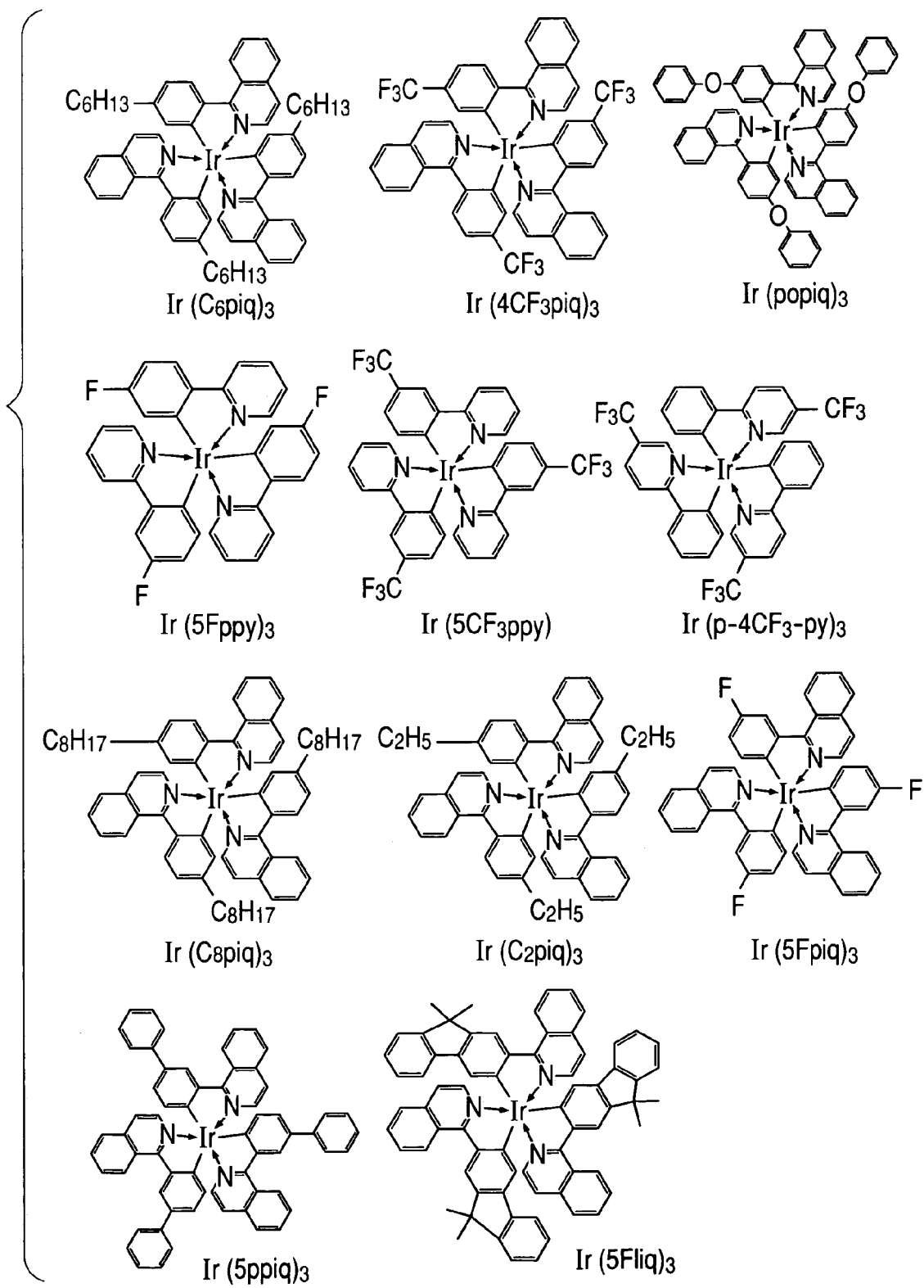
FIG. 5 shows chemical structure of the organic compounds used in the light-emitting device of the present invention.
Figure 6:
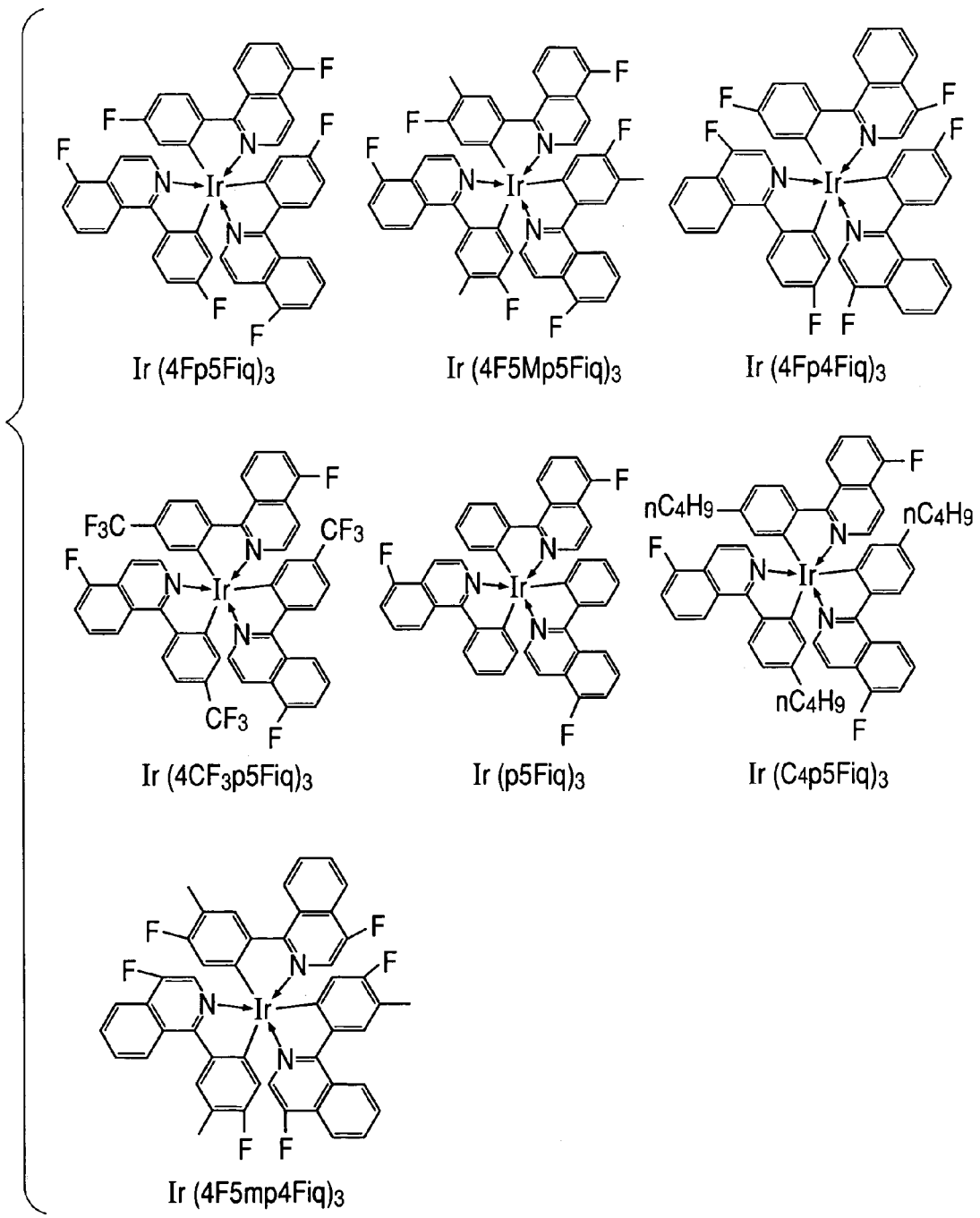
FIG. 6 shows chemical structure of the organic compounds used in the light-emitting device of the present invention.

Next, organic compounds used in the light-emitting device of the present invention will be shown in FIGS. 4, 5 and 6. In particular, a dopant emitting red light is shown. However, the present invention is applicable to emission in any of three primary colors, i.e., red, green, and blue, or to emission in neutral color.

A host material used in the light-emitting layer includes CBP or TAZ, the main light-emitting material includes $Ir(4F5mpiq)_3$ or $Ir(4mopiq)_3$, and the unsubstituted non-light-emitting material includes $Ir(bq)_3$ or $Ir(piq)_3$. Combination examples are summarized in Table 1.

TABLE 1

| First dopant | | Second dopant | |
|---|---|---|---|
| Ligand | Emission wavelength (nm) | Ligand | Emission wavelength (nm) |
| $Ir(bq)_3$ | 585 | $Ir(4Fpiq)_3$ | 605 |
| | | $Ir(4F5mpiq)_3$ | 610 |
| | | $Ir(4mopiq)_3$ | 610 |
| | | $Ir(4mpiq)_3$ | 615 |
| | | $Ir(C6piq)_3$ | 615 |
| | | $Ir(4CF3piq)_3$ | 605 |
| | | $Ir(popiq)_3$ | 610 |
| | | $Ir(4Fp5Fiq)_3$ | 605 |
| | | $Ir(4F5Mp5Fiq)_3$ | 615 |
| | | $Ir(4CF3p5Fiq)_3$ | 610 |
| | | $Ir(4Fp4Fiq)_3$ | 610 |
| $Ir(ppy)_3$ | 510 | $Ir(5Fppy)_3$ | 525 |
| | | $Ir(P-4CF3-py)_3$ | 540 |
| | | $Ir(5CF3-ppy)_3$ | 520 |
| $Ir(dbq)_3$ | 510 | $Ir(5Fppy)_3$ | 525 |
| | | $Ir(P-4CF3-py)_3$ | 540 |
| | | $Ir(5CF3-ppy)_3$ | 520 |
| $Ir(piq)_3$ | 620 | $Ir(C8piq)_3$ | 620 |
| | | $Ir(C2piq)_3$ | 620 |

TABLE 1-continued

| First dopant | | Second dopant | |
|---|---|---|---|
| Ligand | Emission wavelength (nm) | Ligand | Emission wavelength (nm) |
| | | Ir (5Fpiq)$_3$ | 625 |
| | | Ir (5ppiq)$_3$ | 625 |
| | | Ir (Fliq)$_3$ | 650 |
| | | Ir (p5Fiq)$_3$ | 625 |
| | | Ir (C4p5Fiq)$_3$ | 625 |
| | | Ir (4F5Mp4Fiq)$_3$ | 620 |

In the following examples, as a device structure, a device having three organic layers as shown in FIG. 1A was used. FIG. 1A is a schematic sectional view of a light-emitting device according to the present examples. Reference numeral 1 denotes the metal electrode; 2, the electron transporting layer; 3, the light-emitting layer; 4, the hole transporting layer; 5, the transparent electrode; and 6, the transparent substrate.

ITO was patterned and deposited to a thickness of 100 nm on a glass substrate as the transparent substrate 6 to prepare the transparent electrodes 5 having an electrode area of 3 mm$^2$. The following organic layers and electrode layer were continuously formed by vacuum evaporation using resistance heating in a vacuum chamber at a vacuum degree of $10^{-5}$ Pa.

Hole transporting layer (40 nm): FL03
Light-emitting layer (60 nm): CBP (host)+predetermined two kinds of phosphorescent materials (dopants)
Electron transporting layer (50 nm): Bphen
Metal electrode layer 1 (10 nm): KF
Metal electrode layer 2 (100 nm): Al

EXAMPLE 1

CBP was used as a host of the light-emitting layer, and the light-emitting layer was doped with Ir(bq)$_3$ as a short-wavelength light-emitting material unsubstituted in a concentration of 8 wt. % and with Ir(4mopiq)$_3$ as a long-wavelength light-emitting material in a concentration of 4 wt. % to thereby prepare a light-emitting device. The obtained light-emitting device was measured for an efficiency (lm/W at 600 cd/M$^2$), chromaticity (x, y) (measuring device: BM-7 available from TOPCON Co.), lifetime (luminance half-time at the time of driving at 100 mA/cm$^2$ (hr)), and current amount (at the time of applied voltage: 8V). Table 2 shows the result of measurements.

EXAMPLES 2 TO 5

The short-wavelength light-emitting material unsubstituted: Ir(bq)$_3$ and the long-wavelength light-emitting material: Ir(4mopiq)$_3$ were doped in different concentrations. Table 2 shows their respective concentrations and evaluation results of light-emitting device characteristics.

COMPARATIVE EXAMPLES 1 TO 3

The short-wavelength light-emitting material unsubstituted: Ir(bq)$_3$ and the long-wavelength light-emitting material: Ir(4mopiq)$_3$ were doped in different concentrations. Table 2 shows their respective concentrations and evaluation results of light-emitting device characteristics.

The light-emitting layer of each of Examples 1 to 6 of the present invention and Comparative Examples 1 to 3 had the structural isomers of Ir(bq)$_3$. It was confirmed that facial: meridional=95:5.

TABLE 2

| | Doping concentration (%) | | Efficiency | | Chromaticity CIE coordinates | | Lifetime (hr) | | Current amount (mA/cm$^2$) Applied with | |
|---|---|---|---|---|---|---|---|---|---|---|
| | Ir(bq)$_3$ | Ir(4mopiq)$_3$ | lm/W | Evaluation | (x, y) | Evaluation | Luminance half-time | Evaluation | 8 V | Evaluation |
| Example 1 | 8 | 4 | 10.3 | ○ | 0.65, 0.35 | ○ | 40 | ○ | 144 | ○ |
| Example 2 | 7 | 4 | 10.1 | ○ | 0.65, 0.35 | ○ | 26 | Δ | 118 | ○ |
| Example 3 | 10 | 2 | 12.2 | ○ | 0.63, 0.36 | Δ | 26 | Δ | 88 | ○ |
| Example 4 | 10 | 5 | 10 | ○ | 0.65, 0.35 | ○ | 34 | ○ | 92 | ○ |
| Example 5 | 12 | 3 | 11.8 | ○ | 0.64, 0.36 | ○ | 23 | Δ | 282 | ○ |
| Comparative Example 1 | 6 | 1 | 10.5 | ○ | 0.62, 0.37 | x | 23 | Δ | 69 | x |
| Comparative Example 2 | 10 | 0 | 21.4 | ○ | 0.52, 0.47 | x | 35 | ○ | 189 | ○ |
| Comparative Example 3 | 0 | 10 | 7.3 | Δ | 0.66, 0.34 | ○ | 11 | x | 66 | x |

In Table 2, the mark "○" ranks as the most adequate for practical use, and the ranking order is ○>Δ>x.

Considering the efficiency, efficiency of a device of Comparative Example 3 that did not contain an assist dopant, i.e., Ir(bq)$_3$ was used as a reference (represented by the mark "Δ" in Table 2) and efficiency of 10 lm/W or more was judged as the mark "○".

As regards the current amount, a low voltage is preferred in the case of constant-current driving. Hence, a reference voltage was set to 8V, and a current amount was measured and evaluated. When a current density of 70 mA/cm$^2$ is obtained at the reference voltage of 8 V, a drive voltage necessary for obtaining brightness of about 300 cd/m$^2$ with VGA of a 0.3 mm$^2$-pixel can be preferably set to around 5 V. Therefire, the value of 700 mA/cm$^2$ or more was judged as the mark "○" and the value below 700 mA/cm$^2$ was judged as the mark "x".

Regarding the lifetime, the luminance half-time was obtained as a result of a 50-fold acceleration test and thus, in terms of actual time, the lifetime less than 1,000 hours was judged as the mark "x", the lifetime of 1,000 hours or more was judged as the mark "Δ", and the lifetime of 1,500 hours or more was judged as the mark "o".

Regarding the chromaticity, a value deviated by 6% or less from an NTSC standard (red chromaticity coordinates: x=0.68, y=0.32) was used as a reference, the chromaticity with x less than 0.63 was judged as the mark "x", the chromaticity with x equal to 0.63 was judged as the mark "Δ", and the chromaticity with x of 0.64 or more and y of 0.34 or more was judged as the mark "o" for red light emission. Here, the mark "Δ" represents the lowest acceptable value and a range of the mark "o" is preferably used.

The current amount and lifetime vary depending on an amount of the assist dopant. In these example, $Ir(bq)_3$ was used as the assist dopant. It was revealed that due to its concentration change, the light-emitting device characteristic was changed at a certain concentration. More specifically, the lower limit is 7 wt. % and the upper limit is 12 wt. %. A preferable concentration range is 8 wt. % or more and 10 wt. % or less. The evaluation results of the current amount and the lifetime, and the assist dopant concentrations are summarized in Table 3 below.

TABLE 3

| | Doping concentration of $Ir(bq)_3$ | | | | | |
| --- | --- | --- | --- | --- | --- | --- |
| | Concentration | | | | | |
| | 0% | 6% | 7% | 8% | 10% | 12% |
| Current | x | x | o | o | o | o |
| Lifetime | x | x | Δ | o | o | Δ |

From the above, it was found that the efficiency and chromaticity varied depending on the content of the dopant performing the main light emission. The specific amount is 2 wt. % or more and 10 wt. % or less. In the present examples, in order to emit light of red as a primary color, the evaluation result that the doping concentration of $Ir(4mopiq)_3$ was 1 wt. % is judged as the mark "x". However, the concentration of the dopant as the main light-emitting material will be preferably less than 2 wt. %, for example, 1 wt. % insofar as a desired chromaticity can be obtained. In this case, the emission light becomes light close to orange light rather than red light. The evaluation results of the efficiency and the chromaticity, and the concentrations of the dopant as the main light-emitting material are summarized in Table 4 below.

TABLE 4

| | Doping concentration of $Ir(4mopiq)_3$ | | | | | |
| --- | --- | --- | --- | --- | --- | --- |
| | Concentration | | | | | |
| | 0% | 1% | 2% | 3% | 4% | 5% | 10% |
| Efficiency | o | o | o | o | o | o | Δ |
| Chromaticity | x | x | Δ | o | o | o | o |

Figure 2:
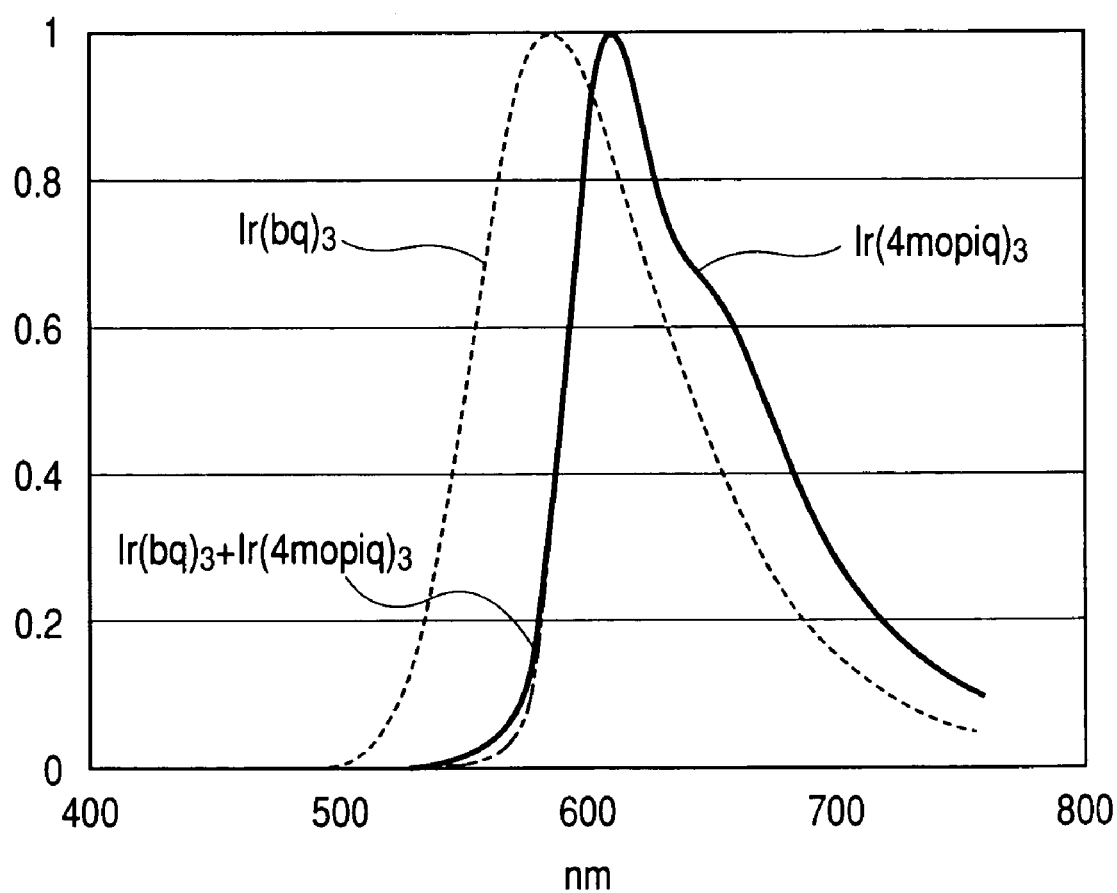
FIG. 2 is a graph showing an emission spectrum.
Figure 3:
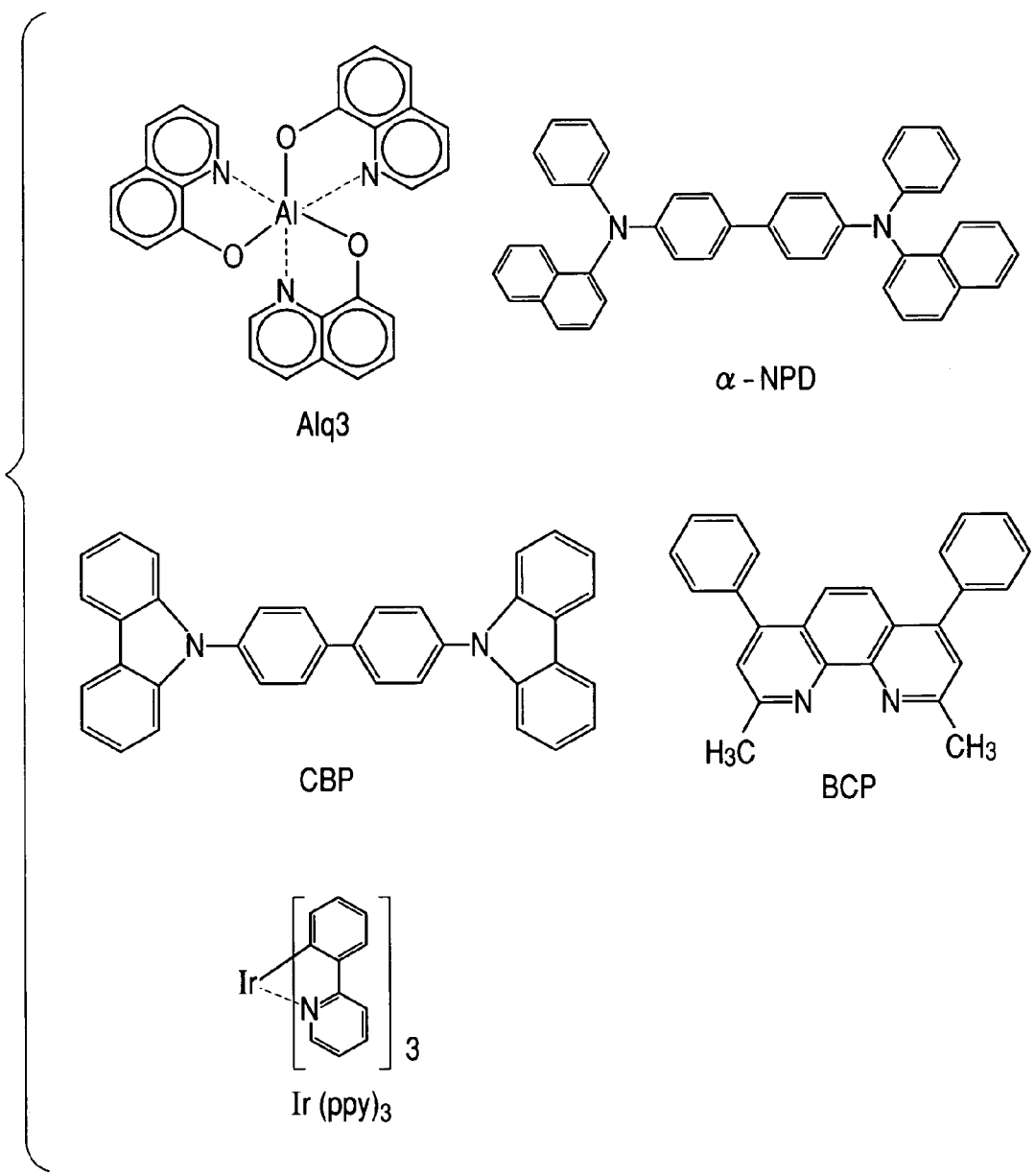
FIG. 3 shows chemical structure of Alq3, α-NPD, CBP, BCP and Ir(ppy)$_3$.

FIG. 2 is a graph showing emission spectrum ($Ir(bq)_3$+Ir $(4mopiq)_3$) in the case of a light emitting device in which the light-emitting layer contains $Ir(4mopiq)_3$ as the dopant for the main light emission, and $Ir(bq)_3$ as the assist dopant; an emission spectrum ($Ir(4mopiq)_3$) in the case of the device in which $Ir(4mopiq)_3$ solely emits light; and an emission spectrum ($Ir(bq)_3$) in the case of the device in which $Ir(bq)_3$ solely emits light. In the graph, λmax of $Ir(4mopiq)_3$ is 610 nm and λmax of $Ir(bq)_3$ is 585 nm. As apparent from the graph, the emission spectrum of $Ir(bq)_3$+$Ir(4mopiq)_3$ is substantially the same as the emission spectrum of $Ir(4mopiq)_3$ and their maximum emission wavelength peaks are substantially the same.

Further, it was confirmed that as for $Ir(4mopiq)_3$ doped at the higher concentration, an effect was obtained at a concentration of 10% or less from the viewpoint of efficiency (lm/W).

EXAMPLE 6

CBP was used as the host of a light-emitting layer, and the light-emitting layer was doped with $Ir(bq)_3$ as a short-wavelength light-emitting material unsubstituted and $Ir(4F5mpiq)_3$ as a long-wavelength light-emitting material in concentrations of 11 wt. % and 3 wt. %, respectively, to thereby prepare a light-emitting device.

Table 5 shows an efficiency (lm/W at 600 cd/m$^2$) and a luminance half-time (hr) at the time of driving at 100 mA/cm$^2$.

COMPARATIVE EXAMPLES 4 AND 5

In Comparative Example 4, a light-emitting device was prepared similarly to Example 6 except that $Ir(4F5mpiq)_3$ was doped alone in a concentration of 10 wt. %. In Comparative Example 5, $Ir(4F5mpiq)_3$ was used as the short-wavelength light-emitting material, $Ir(piq)_3$ was used as the long-wavelength light-emitting material, and the concentrations of the respective dopants were both set to 10 wt. %. The devices were evaluated as in Example 6. The evaluation results of those devices are shown in Table 5.

TABLE 5

| | lm/W | Half-time (hr) |
| --- | --- | --- |
| Example 6 | 11.0 | 40 |
| Comparative Example 4 | 7.3 | 1 |
| Comparative Example 5 | 4.9 | 2.2 |

Spectrum measurement (measuring device: SR-1 available from TOPCON Co.) revealed that the main light-emitting material in Example 6 and Comparative Example 4 was $Ir(4F5mpiq)_3$, and the main light emitting material in Comparative Example 5 was $Ir(piq)_3$.

As apparent from Table 5, doping CBP with the mixture of $Ir(4F5mpiq)_3$ and $Ir(bq)_3$ improved efficiency rather than doping CBP with $Ir(4F5mpiq)_3$ alone, and in addition, a main light-emitting material having a substituent showed effects.

EXAMPLES 7 AND 8, AND COMPARATIVE EXAMPLES 6 AND 7

CBP was used as the host of a light-emitting layer, and the light-emitting layer was doped with $Ir(bq)_3$ as the short-wavelength light-emitting material unsubstituted in a concentration of 10 wt. % and doped with $Ir(4mopiq)_3$ as the long-wavelength light-emitting material in concentrations of 1 wt. % and 3 wt. % to thereby prepare light-emitting devices (Examples 7 and 8). CBP was used as the host of a light-emitting layer, and the light-emitting layer was doped with $Ir(bq)_3$ as the short-wavelength light-emitting material unsubstituted in a concentration of 10 wt. % and doped with $Ir(piq)_3$ as the long-wavelength light-emitting material in concentrations of 1 wt. % and 3 wt. % to thereby prepare ligt-emitting devices (Comparative Examples 6 and 7). Table 6 shows a relation between the concentration of the long-wavelength light-emitting material and the efficiency (lm/W) in the above case.

TABLE 6

|  | 1% | 3% |
|---|---|---|
| Ir(4mopiq)$_3$ | 19.7 cd/A (Example 7) | 17.2 cd/A (Example 8) |
| Ir(piq)$_3$ | 12 cd/A (Comparative Example 6) | 7.7 cd/A (Comparative Example 7) |

It was revealed from Table 6 that an iridium complex having a substituent was less likely to decrease its efficiency at a higher concentration. Ir(piq)$_3$ having no substituent decreased its efficiency down to 60% when its concentration was changed from 1% to 3%, while Ir(4mopiq)$_3$ having a substituent could keep its efficiency at 90% when its concentration was changed from 1% to 3%.

This application claims priority from Japanese Patent Applications No. 2003-305851 filed Aug. 29, 2003 and No. 2004-225630 filed Aug. 2, 2004, which are hereby incorporated by reference herein.

What is claimed is:

1. A light-emitting device comprising:
a pair of electrodes; and
a light-emitting layer provided between the pair of electrodes,
wherein the light-emitting layer has a host and two different dopants, and
wherein each of the two different dopants is a phosphorescent metal complex having an organic ligand, and among the two different dopants, a first dopant having a longer maximum-emission wavelength (i) is contained in the light-emitting layer at a lower concentration than a concentration of a second dopant; (ii) includes a 1-phenylisoquinoline ligand represented by the following general formula (1):

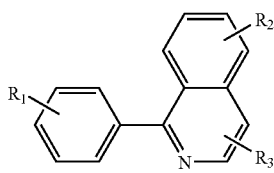

(1)

wherein R1, R2, and R3 are each independently selected from the group consisting of a hydrogen atom, a halogen atom, a cyano group, a nitro group, a disubstituted amino group (the substituents are each independently a phenyl group or naphthyl group that may have a sub stituent (the substituent is a halogen atom, a methyl group, or a trifluoromethyl group), or a linear or branched alkyl group having 1 to 8 carbon atoms where a hydrogen atom in the alkyl group may be substituted by a fluorine atom), a trialkylsilyl group (the alkyl groups are each independently linear or branched alkyl groups having 1 to 8 carbon atoms), and a linear or branched alkyl group having 1 to 20 carbon atoms (one methylene group or two or more unadjacent methylene groups in the alkyl group may be replaced by —O—, —S—, —CO—, —CO—O—, —O—CO—, —CH═CH—, or —C≡C—, and at least one methylene group in the alkyl group may be replaced by a bivalent aromatic ring group that may have a substituent (the substituent is a halogen atom, a cyano group, a nitro group, a trialkylsilyl group (the alkyl groups are each independently linear or branched alkyl groups having 1 to 8 carbon atoms), or a linear or branched alkyl group having 1 to 20 carbon atoms (one methylene group or two or more unadjacent methylene groups in the alkyl group may be replaced by —O—, —S—, —CO—, —CO—O—, —O—CO—, —CH═CH—, or —C≡C—, and a hydrogen atom in the alkyl group may be substituted by a fluorine atom))), and at least one of R1, R2, and R3 is not a hydrogen atom; and (iii) all ligands thereof are bonded to the metal of the metal complex at N and C atoms; and the second dopant is present in amounts of at least 7% by weight based on the total weight of the light emitting layer.

2. A display apparatus comprising a light-emitting device according to claim 1 provided in a display unit.

3. The light-emitting device according to claim 1, wherein a concentration of the second dopant is at most 12% by weight.

4. The light-emitting device according to claim 1, wherein the formula of the second dopant is as follows:

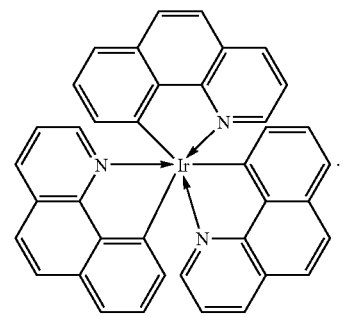

5. The light-emitting device according to claim 1, wherein a concentration of the first dopant having a longer maximum-wavelength is from 2 wt. % to 10 wt. %.

6. The light-emitting device according to claim 1, wherein the formula of the first dopant having a longer maximum-wavelength is one of the formulas as follows:

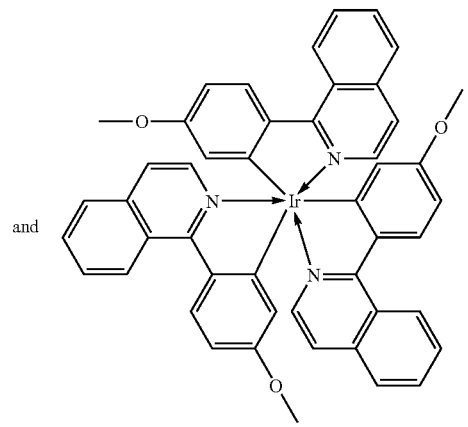

* * * * *

UNITED STATES PATENT AND TRADEMARK OFFICE
CERTIFICATE OF CORRECTION

| | |
|---|---|
| PATENT NO. | : 7,388,327 B2 |
| APPLICATION NO. | : 10/924806 |
| DATED | : June 17, 2008 |
| INVENTOR(S) | : Kengo Kishino et al. |

It is certified that error appears in the above-identified patent and that said Letters Patent is hereby corrected as shown below:

COLUMN 6:

Line 2, "cd/M$^2$)," should read --cd/m$^2$),--; and
Line 64, "Therefire," should read --therefore,--.

COLUMN 7:

Line 17, "example," should read --examples,--.

COLUMN 9:

Line 51, "R1, R2, and R3" should read --R$_1$, R$_2$, and R$_3$--; and
Line 55, "sub stituent" should read --substituent--.

UNITED STATES PATENT AND TRADEMARK OFFICE
CERTIFICATE OF CORRECTION

PATENT NO. : 7,388,327 B2
APPLICATION NO. : 10/924806
DATED : June 17, 2008
INVENTOR(S) : Kengo Kishino et al.

It is certified that error appears in the above-identified patent and that said Letters Patent is hereby corrected as shown below:

COLUMN 10:

Line 12, "R1, R2," should read --$R_1$, $R_2$,--;
Line 13, "R3" should read --$R_3$--;
Line 54, "and" should be deleted; and Line 64 should read --and

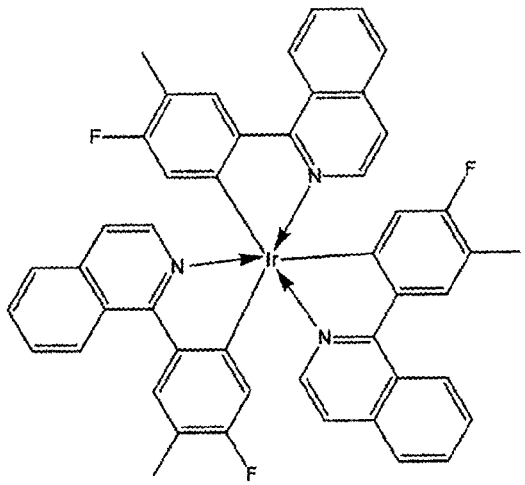

--.

Signed and Sealed this

Second Day of December, 2008

JON W. DUDAS
*Director of the United States Patent and Trademark Office*